US008550343B2

(12) United States Patent
Ko

(10) Patent No.: US 8,550,343 B2
(45) Date of Patent: Oct. 8, 2013

(54) SEPERABLE POINT OF SALE SYSTEM

(75) Inventor: Chun-Shih Ko, New Taipei (TW)

(73) Assignee: Partner Tech Corp., New Taipei (TW)

( * ) Notice: Subject to any disclaimer, the term of this patent is extended or adjusted under 35 U.S.C. 154(b) by 35 days.

(21) Appl. No.: 13/211,736

(22) Filed: Aug. 17, 2011

(65) Prior Publication Data

US 2012/0286040 A1 Nov. 15, 2012

(30) Foreign Application Priority Data

May 11, 2011 (TW) ............................ 100208448 U

(51) Int. Cl.
*G06K 15/00* (2006.01)
*G06F 1/16* (2006.01)
*H05K 5/00* (2006.01)
*H05K 7/00* (2006.01)

(52) U.S. Cl.
USPC ...................................... 235/383; 361/679.41

(58) Field of Classification Search
USPC ............ 235/383; 361/679.26, 679.4, 679.41, 361/679.43, 679.55, 679.01, 679.02, 361/679.04, 679.27, 679.29; 312/223.2; 345/173, 905; 705/16, 17; D14/336, D14/374, 375; 710/303, 304
See application file for complete search history.

(56) References Cited

U.S. PATENT DOCUMENTS 5,604,663 A * 2/1997 Shin et al. ................ 361/679.43
5,619,397 A * 4/1997 Honda et al. ............. 361/679.43
6,005,769 A * 12/1999 Cho ......................... 361/679.41
6,053,410 A * 4/2000 Wike et al. ............... 235/462.43
6,119,184 A * 9/2000 Takahama ..................... 710/303
6,148,243 A * 11/2000 Ishii et al. ......................... 700/94
D458,255 S * 6/2002 Hsu .............................. D14/373
6,424,524 B2 * 7/2002 Bovio et al. .............. 361/679.45
6,487,068 B1 * 11/2002 Rahemtulla .............. 361/679.04
D496,682 S * 9/2004 Ookushi et al. ............... D18/4.4
6,847,520 B2 * 1/2005 Hashimoto .............. 361/679.01
6,952,343 B2 * 10/2005 Sato ......................... 361/679.57
D527,759 S * 9/2006 Ono .............................. D18/4.5
7,256,990 B2 * 8/2007 Grunow et al. .......... 361/679.41
7,359,185 B2 * 4/2008 Hiroyoshi ................ 361/679.55
7,430,674 B2 * 9/2008 von Mueller et al. ......... 713/300
7,654,446 B2 * 2/2010 Lum ............................. 235/379
7,911,779 B1 * 3/2011 Tarnoff .................... 361/679.43

(Continued)

FOREIGN PATENT DOCUMENTS

GB 2490519 A * 11/2012

*Primary Examiner* — Michael G Lee
*Assistant Examiner* — Suezu Ellis
(74) *Attorney, Agent, or Firm* — Grossman, Tucker, Perreault & Pfleger, PLLC

(57) ABSTRACT

A separable point of sale system includes a mainframe and a base. The mainframe has one or more base connecting sockets, a case, a touch screen and a power receiving socket, and the case has a mainframe tenon; the base has an inputting module, one or more mainframe connecting plugs, a base tenon, a power supply plug and a trough used to accommodate the mainframe. The base tenon operatively connects with the mainframe tenon, and the amount of the mainframe connecting plugs and that of the base connecting sockets are the same. When the mainframe tenon connects with the base tenon, the mainframe is vertically placed in the trough. Because the disposition of the power supply plug and the mainframe connection plugs corresponds to that of power receiving socket and the base connection sockets, therefore, as the mainframe tenon connects with the base tenon, the power receiving socket has electrical connection with the power supply plug, and the base connecting sockets have electrical connection with the mainframe connecting plugs, too.

8 Claims, 6 Drawing Sheets

(56) References Cited

U.S. PATENT DOCUMENTS

| | | | | |
|---|---|---|---|---|
| 8,260,998 | B2 * | 9/2012 | Ganesh et al. | 710/303 |
| 2004/0181454 | A1 * | 9/2004 | Manno | 705/21 |
| 2007/0038517 | A1 * | 2/2007 | Lin | 705/17 |
| 2009/0168336 | A1 * | 7/2009 | Yokote et al. | 361/679.55 |
| 2012/0287594 | A1 * | 11/2012 | Ko | 361/809 |
| 2013/0107445 | A1 * | 5/2013 | Reber et al. | 361/679.41 |

* cited by examiner

SEPERABLE POINT OF SALE SYSTEM

This application claims priority to Taiwan Patent Application No. 100208448 filed on May 11, 2011.

CROSS-REFERENCES TO RELATED APPLICATIONS

Not applicable.

BACKGROUND OF THE INVENTION

1. Field of the Invention

The present invention is relates to a point of sale system with separate a mainframe and a base. More specifically, the point for sale system has connectable ports when the mainframe and the base connect to each other.

2.Descriptions of the Related Art

As technology develops, some restaurants, retailers, hotels or shopping malls gradually abandon traditional cash registers and adopt point of sale system (POS) as electronic systems for displaying, counting, billing, or reserves tracing. With the use of POS, manufacturers or sellers can readily integrate the needs of each stage in the industry, so as to improve the efficiency of business management.

However, conventional POS needs to be fixed to a fixture, like a wall or a table. The input devices, such as magnetic strip readers for credit cards or barcode readers, are usually installed directly on conventional POS, and the POS often connects to the Internet via wired network, so that conventional POS has difficulties being relocated and is inconvenient to be portable.

In addition, some conventional wireless POS connect to the Internet via a wireless network, nevertheless, because users often carry the POS to move around, and because there is no fixed devices to accommodate the POS, the user often forgets where the POS is placed. Some conventional wireless POS has a diagonal with length less than 10 inches, so that content in a page is less with smaller font, which makes users have difficulties in reading the content shown on the screen of the conventional POS.

SUMMARY OF THE INVENTION

To attain the above objective, the first aspect of this invention provides a separable POS. The POS comprises a mainframe and a base, and the mainframe and the base is separable. When the mainframe and the base are separate, they are electrically disconnected; on the other way, when they are combined, they are electrically connected.

In addition, the mainframe has one or more base connecting sockets, a case with a mainframe tenon, a touch panel and a power receiving socket. Further, the touch panel is in the middle of the case. The base connecting sockets and the power receiving socket are at the same side of the case. The base has an inputting module, one or more than one mainframe connecting plugs, a base tenon, a power supply plug and a trough used to place the mainframe, wherein the base tenon separably connects with the mainframe tenon, and the amount of the mainframe connecting plugs and that of the base connecting sockets are the same. When the mainframe tenon connects with the base tenon, the mainframe is vertically placed in the trough, which avoids the vertical movement of the mainframe. Because the disposition of the power supply plug and the mainframe connecting plugs corresponds to that of power receiving socket and the base connecting sockets, therefore, as the mainframe tenon connects with the base tenon, the power receiving socket has electrical connection with the power supply plug, and the base connecting sockets have electrical connection with the mainframe connecting plugs, too.

The primary objective of this invention is to provide a POS with a set of separate mainframe and base, so that the separate POS is convenient to be portable. Since the weight of mainframe of the POS is lighter than that of the whole POS, users may carry the mainframe without the base and go to a warehouse to make an inventory check, or introduce products or dishes for customers. Waiters can also show dishes on the touch panel and record what customers order. Furthermore, when the mainframe and the base are electrically connected, the mainframe can be electrified through the power supply plug, so that users will be able to connect the mainframe and the base while they stop using the mainframe, and avoid the problem of the users forgetting where the mainframe is placed since the mainframe is so convenient to carry. This results in less difficulties of managing and storing up.

Another objective of this invention is to make the mainframe and the base be able to connect with each other. In order to reduce the weight of the mainframe, the inputting module and the outputting module can be set on the base. The inputting module can be one of the magnetic strip readers for credit cards, a smart card reader, a barcode reader, an RFID sensor, an information button reader (i-button reader), and a finger print reader. The outputting module can be at least one of the device chose from a screen and a loudspeaker. When the mainframe tenon and the base tenon connect with each other, the power receiving socket and the power supply plug are electrically connected. At this moment, the information that the base receives from the inputting module can be transmitted to the mainframe through the mainframe connecting plugs and the base connecting sockets. The information or instructions from the mainframe can also be transmitted to the screen or the loudspeaker through the base connecting sockets and the mainframe connecting plugs.

Yet a further objective of this invention is to provide a separable POS with a touch panel so that the separable POS is portable and could be input easily. As a result, users can use the touch panel as an instruction inputting device. This structure can save the weight and volume of conventional input device, such as a keyboard or a mouse. In addition, the touch panel would be better if the length of its diagonal is at least 10 inches, so that users may browse more contents without enduring the small fonts.

Yet a further objective of this invention is to provide a separable POS with an external port. The separable POS can further electrically connect with an external module with the external port. The external module includes at lease one of the device chose from an external panel, a printer, a magnetic strip readers for credit cards, a smart card reader, a barcode reader, and a finger print reader. Users can use the external module (such as external panel or a printer) to read the information of the mainframe or the base. The mainframe can also gather external information from the external module (such as a magnetic strip readers for credit cards, a smart card reader, a barcode reader, or a finger print reader) and transmit the information from the external module to the base through the external port, and further transmit the information to the mainframe through the base connecting sockets and the mainframe connecting plugs.

The detailed technology and preferred embodiments implemented for the subject invention are described in the following paragraphs accompanying the appended drawings for people skilled in this field to well appreciate the features of the claimed invention.

DESCRIPTION OF THE PREFERRED EMBODIMENT

Figure 1:
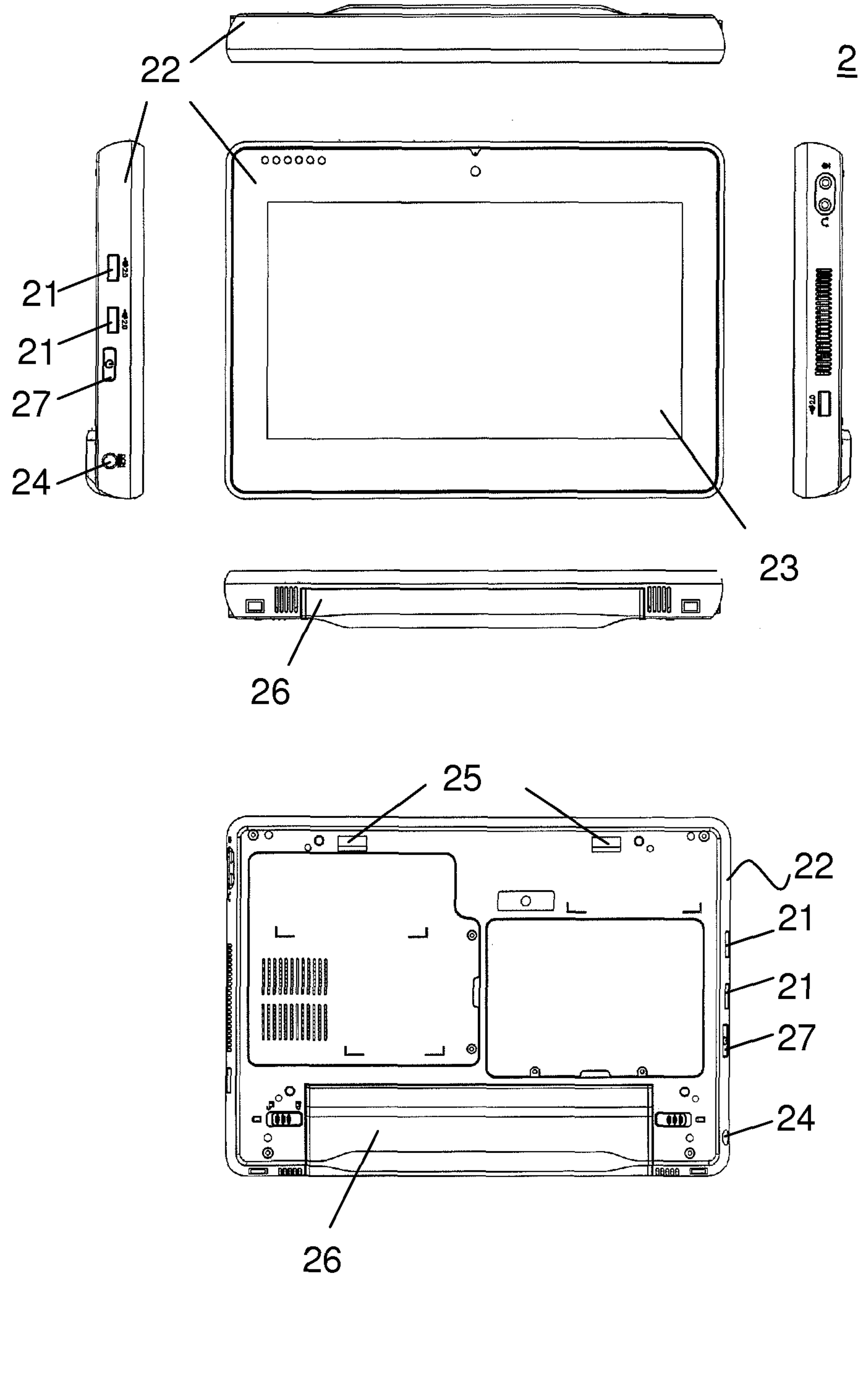
FIG. 1 is a multiple view of a mainframe.

FIG. 1 shows a mainframe 2 for a separable point of sale system (POS). The mainframe 2 has a touch panel 23 disposed in the middle of a case 22, and the touch panel 23 can be used as a instruction inputting device directly, so that the volume and weight of other inputting devices, such as keyboard and mouse, can be reduced to obtain the convenience of carrying. In a better embodiment, the length of the diagonal is at least 10 inches, so that users may browse more contents in a page without enduring the small font. The mainframe 2 has one or more base connecting sockets 21 and one power receiving socket 24, and the base connecting sockets 21 as well as the power receiving socket 24 are at one side of the case 22. In a better embodiment, the mainframe 2 further comprises a power switch 27 and a rechargeable battery 26, so that users can use the power switch 27 to control the operation of the mainframe 2, and the power of the mainframe 2 can be provided by the rechargeable battery 26, and the rechargeable battery 26 may be electrified through the power receiving socket 24. In addition, the case 22 of the mainframe 2 has one or more mainframe tenons 25, and, in another better embodiment, the mainframe tenons 25 are set at the side of the mainframe which is contrary to the one contacts with the touch panel 23, so that the horizontal movement of the mainframe 2 can be avoided. For persons skilled in the art, the amount and the disposition of the base connecting sockets 21, the power receiving socket 24 and the mainframe tenon 25 can be adjusted by actual needs. The amount and the disposition of the base connecting sockets 21, the power receiving socket 24 and the mainframe tenon 25 shown in FIG. 1 shall not be used to limit the present invention.

Figure 2:
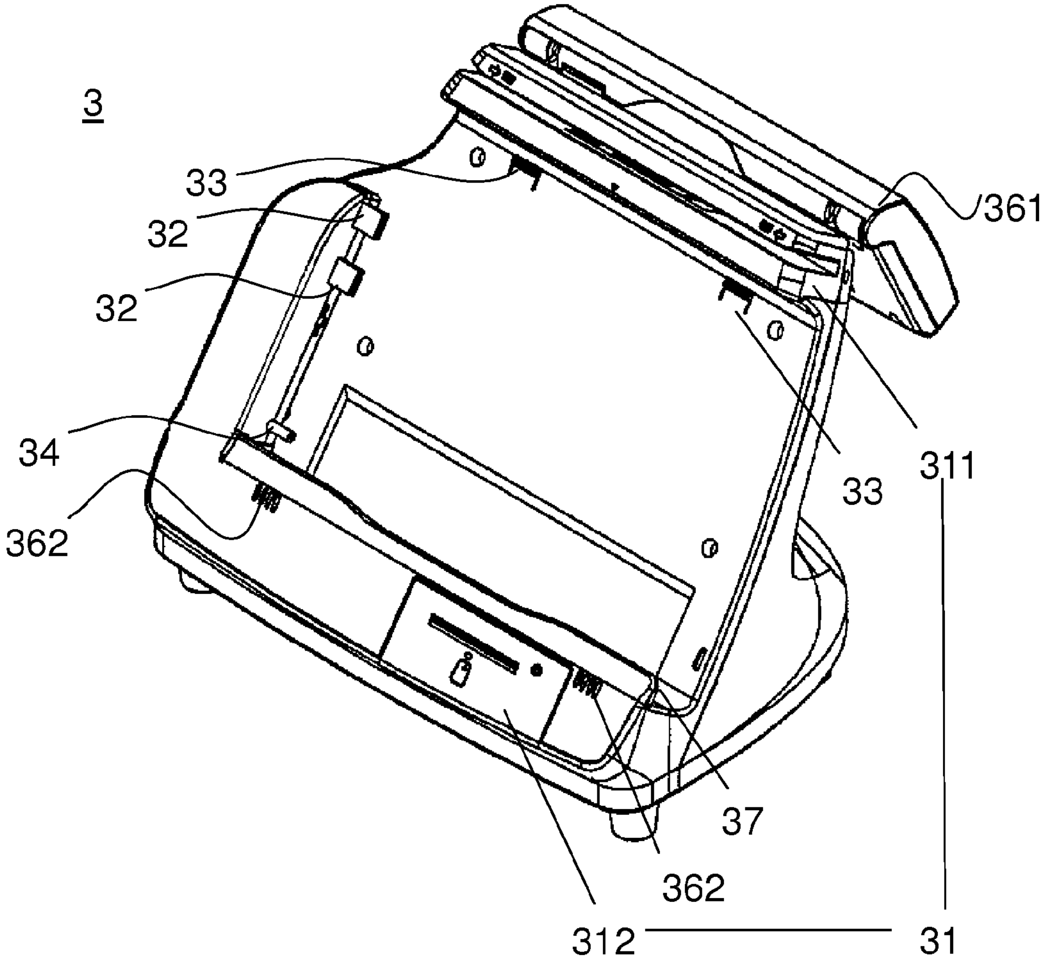
FIG. 2 is a perspective assembly view of a base.
Figure 3:
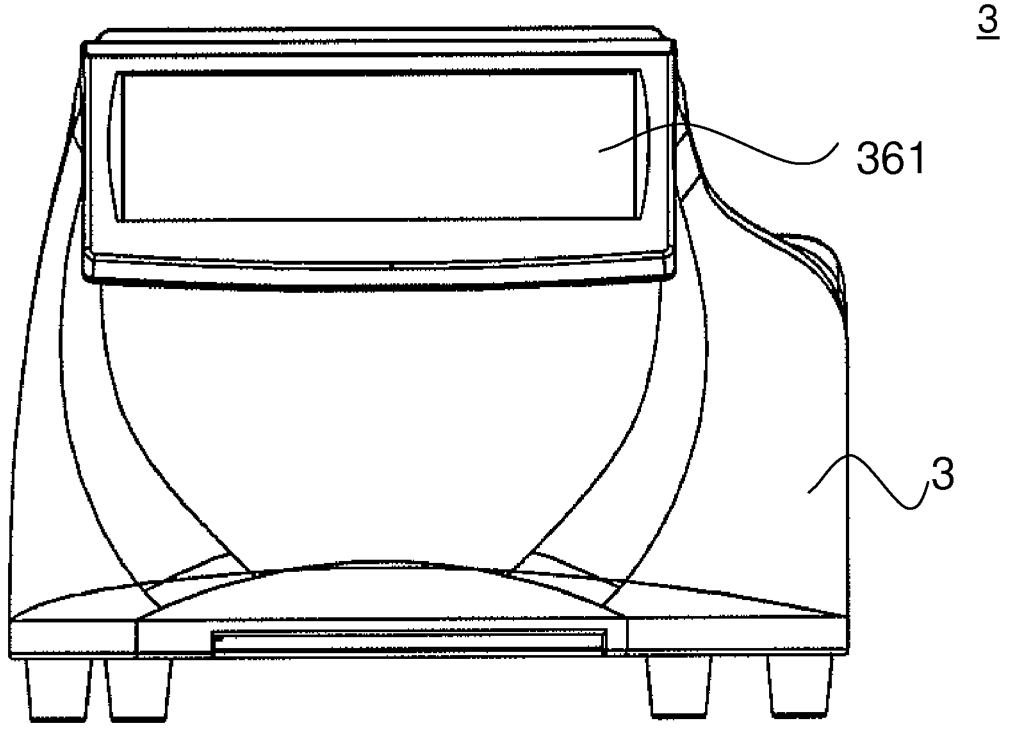
FIG. 3 is another perspective assembly view of a base.

FIG. 2 and FIG. 3 show a base 3 for a separable POS 1. The base 3 has one or more mainframe connecting plugs 32, a base tenon 33, a power supply plug 34, and one trough 37 used to place the mainframe 2. The base tenon 33 is separably connected with the mainframe 25 in FIG. 1. The amount of the mainframe connecting plugs 32 and that of the base connecting sockets 21 are the same, and the disposition of the power supply plug 34 and the mainframe connecting plugs corresponds to that of the power receiving socket and the base connecting sockets.

The base 3 further comprises one or more inputting module 31, and the inputting module can be at least one of the magnetic strip readers for credit cards 311, a smart card reader 312, a barcode reader, and an RFID sensor, an information button reader (i-button reader), and a finger print reader. Take FIG. 2 for example, the base comprises a magnetic strip readers for credit cards 311 and a smart care reader 312, and users can replace them with at least one of a barcode reader, an RFID sensor, an i-button reader, and a finger print reader. The base 3 may also have one or more outputting module, the outputting module can be one of the screen 361 and a loudspeaker 362, so that users may read the information or listen to the sound message from the base or from the mainframe transmitted through the base connecting sockets 21 and the mainframe connecting plugs 32. For persons skilled in the art, the amount and the disposition of the mainframe connecting plugs 32, the inputting modules 31, the base tenons 33 and the power supply plugs 34 can be adjusted by actual needs. The amount and the disposition of the mainframe connecting plugs 32, the inputting modules 31, the base tenons 33 and the power supply plugs 34 shown in FIG. 2 and FIG. 3 shall not be used to limit the present invention.

Figure 4:
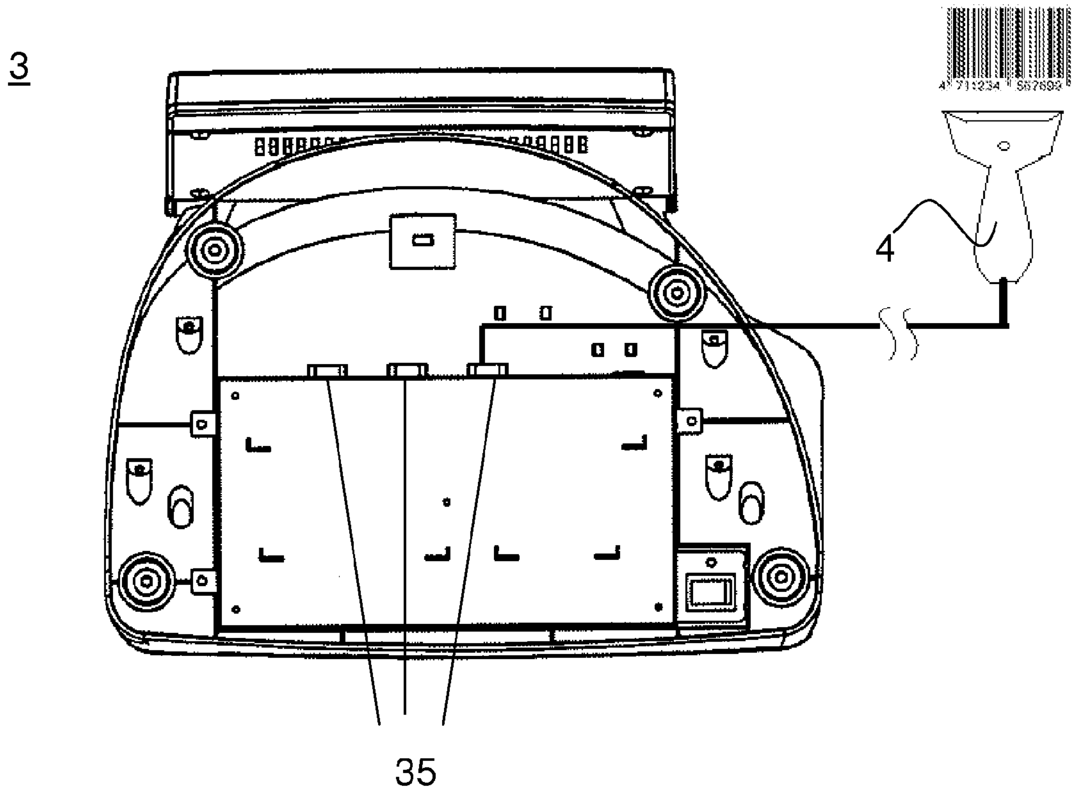
FIG. 4 is a perspective assembly view of a base connected with a barcode reader.

FIG. 4 shows a base 3 of a separable POS. There are plural external ports 35 in the bottom of base 3, and the external ports 35 are used to connected with an external module wherein the external module can be one of the an external panel, a printer, a magnetic strip readers for credit cards, a smart card reader, a barcode reader 4, and a finger print reader. Take FIG. 4 for instance, the base 3 connects with a barcode reader 4 through an external port 35. Users can use the external barcode reader 4 to read a barcode and transmit the information to the base 3. Users can replace the barcode reader 4 with an external panel, a printer, a magnetic strip readers for credit cards, a smart card reader and a finger print reader. For persons skilled in the art, the amount, the category and the disposition of the external ports and external modue can be adjusted by actual needs. The amount, the category and the disposition of the external ports and external modue shown in FIG. 4 shall not be used to limit the present invention.

Figure 5:
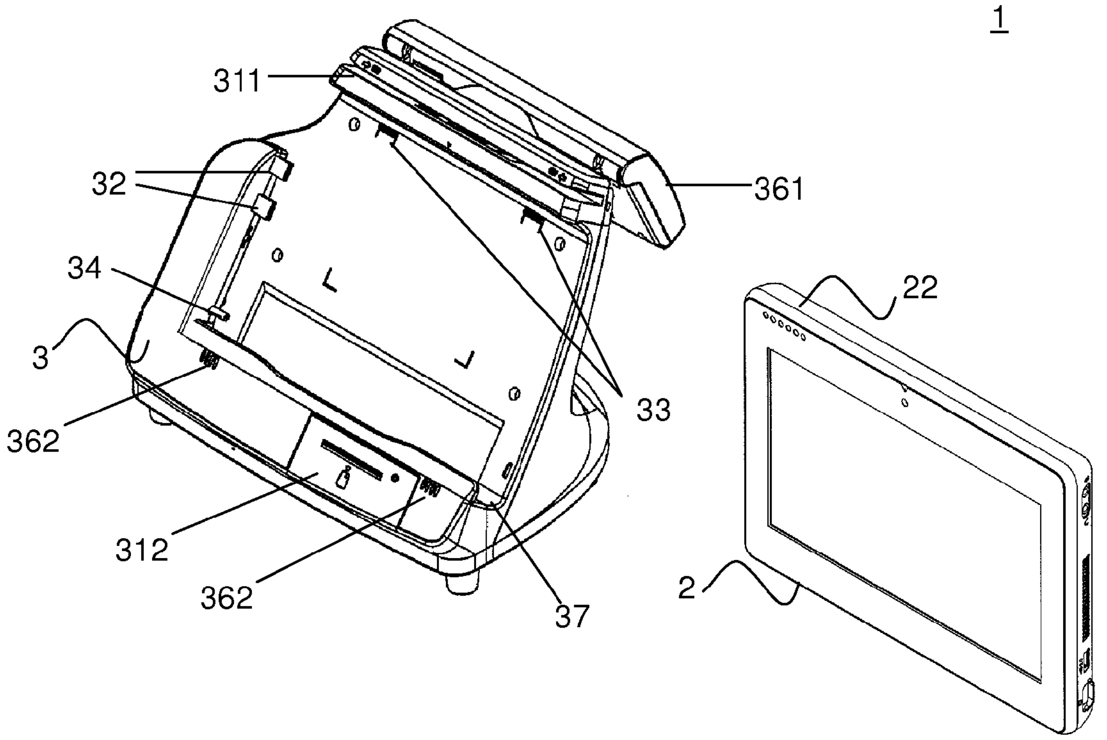
FIG. 5 is a perspective assembly view of a base separating from a mainframe.

FIG. 5 shows an embodiment of the present invention, which includes a mainframe 2 and a base 3 separating from each other. In this embodiment, users can use or take the mainframe 2 alone, without moving the base 3 altogether, so that the mobility and convenience is increased.

Figure 6:
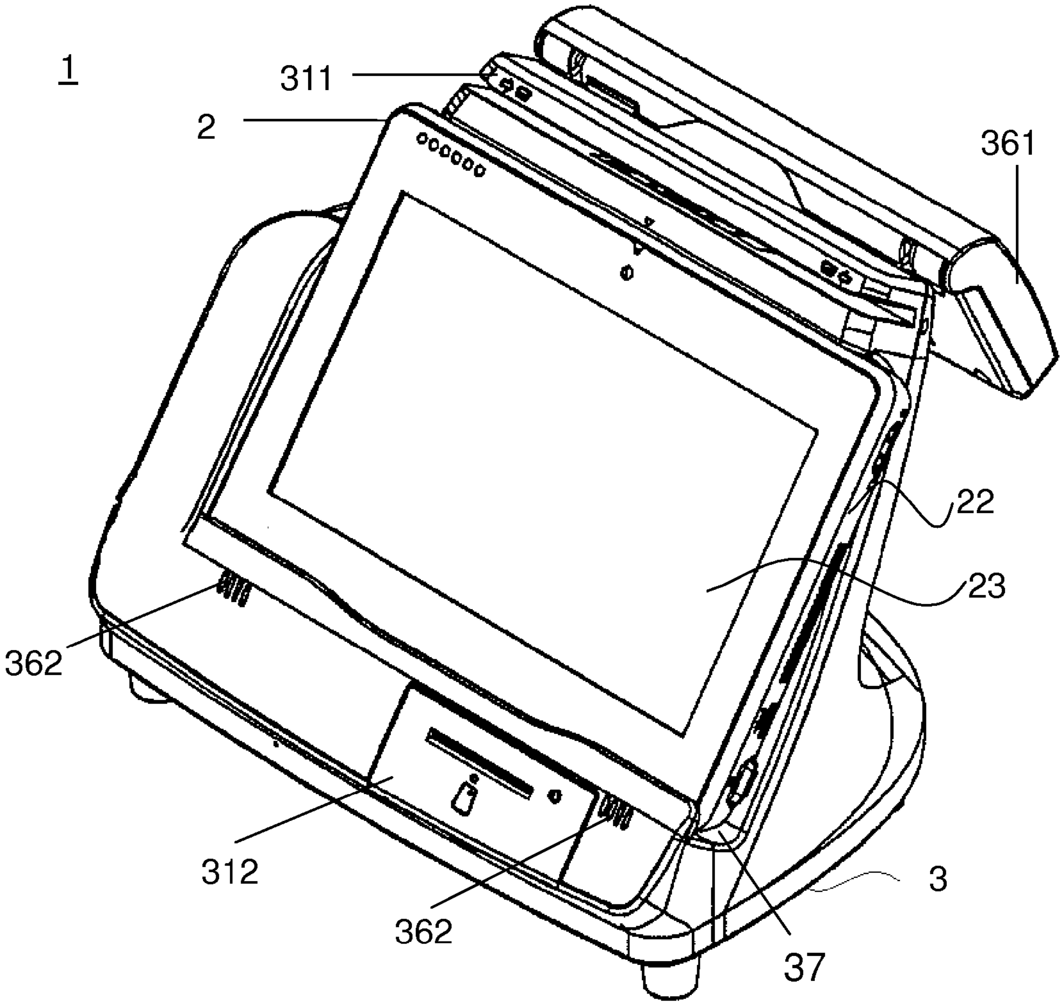
FIG. 6 is another perspective assembly view of a base connected with a mainframe.

FIG. 6 shows another embodiment of the present invention, which includes a mainframe 2 and a base 3 connected with each other. In this embodiment, the mainframe tenons 25 in FIG. 1 as well as the base tenons 33 in FIG. 2 and FIG. 3 are connected with each other in order to avoid horizontal movement of the mainframe 2 resulting from slight shake. Besides, the mainframe 2 is placed in the trough 37 in order to avoid vertical movement of the mainframe 2.

Since the amount of the mainframe connecting plugs 32 and that of the base connecting sockets 21 are the same, and the disposition of the power supply plug 34 and the mainframe connecting plugs 32 corresponds to that of the power receiving socket 24 and the base connecting sockets 21, therefore, when the mainframe tenons 25 in FIG. 1 connects with the base tenons 33 in FIG. 2 and FIG. 3, the base connecting sockets 21 and the power receiving socket 24 are electrically connected with the mainframe connecting plugs 32 and the power supply plug 34 in FIG. 2 and FIG. 3 respectively. Meanwhile, the electricity of the base 3 will be transmitted to the mainframe 2 through the power supply plug 34 and the power receiving socket 24, so that the mainframe 2 can operate in order and the rechargeable battery 26 of the mainframe 2 can be electrified.

In addition, the information received from the magnetic strip readers for credit cards 311, a smart card reader 312 can be transmitted to the mainframe 2 through the base connecting sockets 21 and the mainframe connecting plugs 32. The information received from the mainframe 2 may be displayed on the screen 361 or transmitted to an loudspeaker 362 through the base connecting sockets 21 and the mainframe connecting plugs 32, too. For persons skilled in the art, the amount, the category and the disposition of the inputting modules 31 and the outputting modules can be adjusted by actual needs. The amount, the category and the disposition of the inputting modules 31 and the outputting modules shown in FIG. 6 shall not be used to limit the present invention.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A separable point of sale system comprising:

a mainframe, having one or more base connecting sockets, a case with a mainframe tenon, a touch panel and a power receiving socket, wherein the touch panel is disposed in the middle of the case, with the base connecting sockets and the power receiving socket disposed at a same side of the case; and a base, having an inputting module, one or more mainframe connecting plugs, a base tenon, an outputting module, a power supply plug and a trough used to accommodate the mainframe, wherein the base tenon is able to operatively connect with the mainframe tenon, wherein a number of the mainframe connecting plugs and a number of the base connecting sockets are the same, wherein the outputting module is a screen;

wherein the power supply plug and the power receiving socket being arranged correspondingly wherein the mainframe connecting plugs as well as the base connecting sockets being arranged correspondingly;

wherein when the mainframe tenons connect with the base tenons, the mainframe is vertically placed in the trough to avoid the vertical movement of the mainframe;

wherein when the mainframe tenons connect with the base tenons, the power supply plug electrically connects with the power receiving socket and the base connecting sockets electrically connect with the mainframe connecting plugs when the mainframe connects with the base.

2. The separable point of sale system of claim 1, wherein the touch panel has a diagonal length of at least 10 inches.

3. The separable point of sale system of claim 2, wherein the inputting module is at least one of a magnetic strip readers for credit cards, a smart card reader, a barcode reader, an RFID sensor, an information button reader, and a finger print reader.

4. The separable point of sale system of claim 2, wherein the base further comprises an external port for connecting an external module, wherein the external module is at least one of an external panel, a printer, a magnetic strip readers for credit cards, a smart card reader, a barcode reader, and a finger print reader.

5. The separable point of sale system of claim 2, wherein the outputting module further comprises a loudspeaker.

6. The separable point of sale system of claim 1, wherein the inputting module is at least one of a magnetic strip readers for credit cards, a smart card reader, a barcode reader, an RFID sensor, an information button reader, and a finger print reader.

7. The separable point of sale system of claim 1, wherein the base further comprises an external port for connecting an external module, wherein the external module is at least one of an external panel, a printer, a magnetic strip readers for credit cards, a smart card reader, a barcode reader, and a finger print reader.

8. The separable point of sale system of claim 1, wherein the outputting module further comprises a loudspeaker.

* * * * *